(12) United States Patent
Wang

(10) Patent No.: US 11,329,055 B2
(45) Date of Patent: May 10, 2022

(54) SEMICONDUCTOR DEVICE AND METHODS OF FORMING AND OPERATING THE SAME

(71) Applicants: Semiconductor Manufacturing International (Shanghai) Corporation, Shanghai (CN); Semiconductor Manufacturing International (Beijing) Corporation, Beijing (CN)

(72) Inventor: Nan Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/844,044

(22) Filed: Apr. 9, 2020

(65) Prior Publication Data

US 2020/0328217 A1    Oct. 15, 2020

(30) Foreign Application Priority Data

Apr. 12, 2019 (CN) .......................... 201910295393.6

(51) Int. Cl.
*H01L 27/11* (2006.01)
*H01L 29/06* (2006.01)
*H01L 29/08* (2006.01)

(52) U.S. Cl.
CPC ...... *H01L 27/1104* (2013.01); *H01L 29/0649* (2013.01); *H01L 29/0665* (2013.01); *H01L 29/0847* (2013.01)

(58) Field of Classification Search
CPC ............. H01L 27/1104; H01L 29/0649; H01L 29/0655; H01L 29/0669; H01L 29/0676; H01L 29/0847; H01L 29/41741; H01L 29/66666; H01L 29/7827; H01L 29/78642; H01L 29/0653; H01L 29/0843; H01L 29/6659; H01L 29/66598; H01L 29/7833; H01L 29/7834; H01L 29/7835; H01L 29/78621; H01L 29/78627; H01L 29/7863

See application file for complete search history.

(56) References Cited

U.S. PATENT DOCUMENTS

| | | | | |
|---|---|---|---|---|
| 9,530,866 | B1* | 12/2016 | Zhang | H01L 29/0676 |
| 2015/0303270 | A1* | 10/2015 | Liaw | H01L 23/528 257/9 |
| 2019/0067475 | A1* | 2/2019 | Liu | H01L 29/0847 |
| 2020/0251558 | A1* | 8/2020 | Hashemi | H01L 29/1037 |
| 2020/0350305 | A1* | 11/2020 | Yamagami | H01L 23/5286 |

* cited by examiner

*Primary Examiner* — David C Spalla
(74) *Attorney, Agent, or Firm* — Anova Law Group, PLLC

(57) ABSTRACT

Semiconductor cell and its forming method and operating method are provided. The semiconductor device includes: a substrate with a first region; a first nanopillar, formed on a substrate surface of the first region and perpendicular to the substrate surface; a first source/drain region, formed at a bottom of the first nanopillar and in a portion of the substrate in the first region; a first gate structure, surrounding the first nanopillar and formed on the first source/drain region; and a second source/drain region, formed at a top of the first nanopillar and on the first gate structure.

16 Claims, 4 Drawing Sheets

SEMICONDUCTOR DEVICE AND METHODS OF FORMING AND OPERATING THE SAME

CROSS-REFERENCES TO RELATED APPLICATIONS

This application claims priority of Chinese Patent Application No. 201910295393.6, filed on Apr. 12, 2019, the entire contents of which are hereby incorporated by reference.

FIELD OF THE DISCLOSURE

The present disclosure generally relates to the field of semiconductors and, more particularly, relates to a semiconductor device and its forming method and operating method.

BACKGROUND

As a member of volatile memories, a semiconductor device including a static random-access memory (SRAM) cell has the advantages of high speed, low power consumption and compatibility with standard processes. The semiconductor device is widely used in PC, personal communication, consumer electronics (smart cards, digital cameras, multimedia players) and other fields.

A semiconductor device such as a SRAM cell typically has a 6T structure. A common 6T SRAM cell usually includes a memory unit and two read/write units. The memory cell includes two pull-up transistors and two pull-down transistors. The two pull-up transistors are connected to word lines. The two pull-down transistors are connected to the ground. The memory unit has two memory nodes and two open nodes for storing 1 or 0 signals. The two read/write units are two transfer transistors. One end of each transfer transistor is connected to a memory node and an open node of the memory unit. The other end of each transfer transistor is connected to a bit line for reading and writing the memory unit.

However, there is a need to provide a semiconductor device and methods thereof with improved performance.

BRIEF SUMMARY OF THE DISCLOSURE

One aspect of the present disclosure provides a semiconductor device. The semiconductor device includes: a substrate with a first region; a first nanopillar, formed on a substrate surface of the first region and perpendicular to the substrate surface; a first source/drain region, formed at a bottom of the first nanopillar and in a portion of the substrate in the first region; a first gate structure, surrounding the first nanopillar and formed on the first source/drain region; and a second source/drain region, formed at a top of the first nanopillar and on the first gate structure.

Another aspect of the present disclosure provides a forming method of a semiconductor device. The method includes: providing a substrate with a first region; forming a first nanopillar on a substrate surface of the first region, the first nanopillar being perpendicular to the substrate surface; forming a first source/drain region at a bottom of the first nanopillar and in a portion of the substrate in the first region; forming a first gate structure on the first source/drain region, the first gate structure surrounding the first nanopillar; and forming a second source/drain region at a top of the first nanopillar and on the first gate structure.

Another aspect of the present disclosure provides an operating method of a semiconductor device. The operating method includes: providing the semiconductor device with a substrate, the substrate including a first region, a first nanopillar formed on a substrate surface of the first region and perpendicular to the substrate surface, a first source/drain region formed at a bottom of the first nanopillar and in a portion of the substrate in the first region, a first gate structure surrounding the first nanopillar and formed on the first source/drain region, and a second source/drain region formed at a top of the first nanopillar and on the first gate structure; connecting first bit line signals to the second source/drain region; and connecting word line signals to the first gate structure.

Other aspects or embodiments of the present disclosure can be understood by those skilled in the art in light of the description, the claims, and the drawings of the present disclosure.

DETAILED DESCRIPTION

Figure 1:
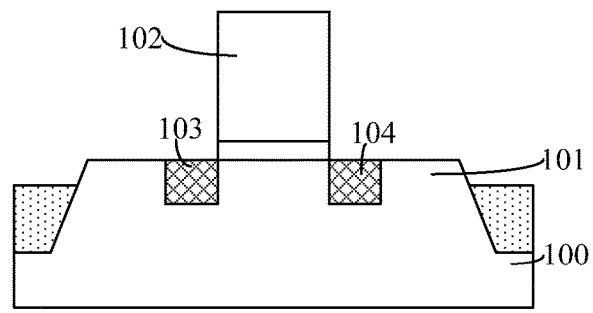
FIG. 1 illustrates a schematic diagram of a semiconductor device.

FIG. 1 illustrates a schematic diagram of a semiconductor device. The semiconductor device includes a substrate 100, a fin portion 101 formed on a substrate surface of the substrate 100, a gate structure 102 spanning the fin portion 101, a source region 103 in the fin portion 101 on one side of the gate structure 102, and a drain region 104 in the fin portion 101 on the other side of the gate structure 102.

Since the source region 103 and the drain region 104 are respectively on the fin portion 101 on the two sides of the gate structure 102, the occupied areas of the source region 103 and the drain region 104 on the fin portion 101 are large, which is disadvantageous for improving integration degree of semiconductor device.

In order to solve the above technical problem, the present disclosure provides a semiconductor device. The semiconductor device includes a substrate with a first region; a first nanopillar, formed on a substrate surface of the first region and perpendicular to the substrate surface; a first source/drain region, formed at a bottom of the first nanopillar and in a portion of the substrate in the first region; a first gate structure surrounding the first nanopillar and formed on the first source/drain region; and a second source/drain region formed at a top of the first nanopillar and on the first gate structure. The second source/drain region and the first source/drain region are asymmetric. The semiconductor device occupies a small area, thereby improving integration of semiconductor device.

In order to make the above objects, features, and beneficial effects of the present disclosure comprehensible, specific embodiments of the present disclosure in the following are described in detail with reference to the accompanying drawings FIGS. 2-8 illustrate schematic diagrams at certain stages during a forming process of an exemplary semiconductor device consistent with various disclosed embodiments in the present disclosure.

The following description takes a SRAM cell forming a 6T structure as an example. The 6T SRAM cell includes a first transfer transistor, a second transfer transistor, a first pull-up transistor, a second pull-up transistor, a first pull-down transistor and a second pull-down transistor. The first transfer transistor, the first pull-up transistor, and the first pull-down transistor constitute a first memory cell. The second transfer transistor, the second pull-up transistor, and the second pull-down transistor constitute a second memory unit. The SRAM cell includes the first memory unit and the second memory unit.

Figure 2:
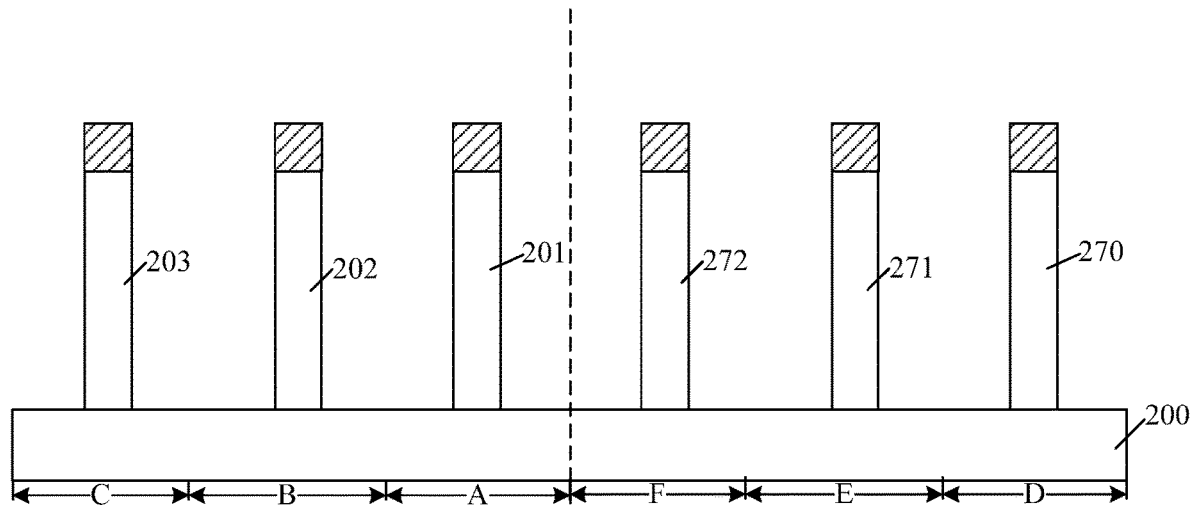
FIGS. 2-8 illustrate schematic diagrams at certain stages during a forming process of an exemplary semiconductor device consistent with various disclosed embodiments in the present disclosure.

Referring to FIG. 2, a substrate 200 is provided. The substrate 200 includes a first region A. A first nanopillar 201 is formed on a surface of the first region A. The first nanopillar 201 is perpendicular to the surface of the substrate 200.

In one embodiment, the substrate further includes a second region B, a third region C, a fourth region D, a fifth region E, and a sixth region F. A second nanopillar 202 is formed on a surface of the substrate 200 in the second region B. The second nanopillar 202 is perpendicular to the surface of the substrate 200. A third nanopillar 203 is formed on a surface of the substrate 200 in the third region C. The third nanopillar 203 is perpendicular to the surface of the substrate 200. A fourth nanopillar 270 is formed on a surface of the substrate 200 in the fourth region D. The fourth nanopillar 270 is perpendicular to the surface of the substrate 200. A fifth nanopillar 271 is formed on a surface of the substrate 200 in the fifth region E. The fifth nanopillar 271 is perpendicular to the surface of the substrate 200. A sixth nanopillar 272 is formed on a surface of the substrate 200 in the sixth region F. The sixth nanopillar 272 is perpendicular to the surface of the substrate 200.

The first region A is configured to form a first transfer transistor. The second region B is configured to form a first pull-down transistor. The third region C is configured to form a first pull-up transistor. The fourth region D is configured to form a second transfer transistor. The fifth region E is configured to form a second pull-down transistor. The sixth region F is configured to form a second pull-up transistor.

In one embodiment, forming steps of the substrate 200, the first nanopillar 201, the second nanopillar 202, the third nanopillar 203, the fourth nanopillar 270, the fifth nanopillar 271, and the sixth nanopillar 272 includes providing an initial substrate, a first mask layer (not shown) being formed on the initial substrate; the first mask layer exposing a portion of top surfaces of the initial substrate in the first region A, the second region B, and the third region C; etching the initial substrate with the first mask layer as a mask to form the substrate 200 in the first region A, the first nanopillar 201 on a surface of the substrate 200 in the first region A, the second nanopillar 202 on a surface of the substrate 200 in the second region B, and the third nanopillar 203 on a surface of the substrate 200 in the third region C.

In one embodiment, a material of the initial substrate is silicon. Correspondingly, materials of the substrate 200, the first nanopillar 201, the second nanopillar 202, the third nanopillar 203, the fourth nanopillar 270, the fifth nanopillar 271, and the sixth nanopillar 272 are silicon.

In other embodiments, the material of the initial substrate includes germanium, silicon germanium, silicon on insulator or germanium on insulator. Correspondingly, the materials of the substrate 200, the first nanopillar 201, the second nanopillar 202, the third nanopillar 203, the fourth nanopillar 270, the fifth nanopillar 271, and the sixth nanopillar 272 include: germanium, silicon germanium, silicon on insulator or germanium on insulator.

A material of the first mask layer includes a nitride of silicon, an oxide of silicon or an oxynitride of silicon. The first mask layer serves as a mask used to form the substrate 200, the first nanopillar 201, the second nanopillar 202, the third nanopillar 203, the fourth nanopillar 270, the fifth nanopillar 271, and the sixth nanopillar 272.

The process of etching the initial substrate with the first mask layer as a mask includes: one or a combination of a dry etching process and a wet etching process.

Figure 3:
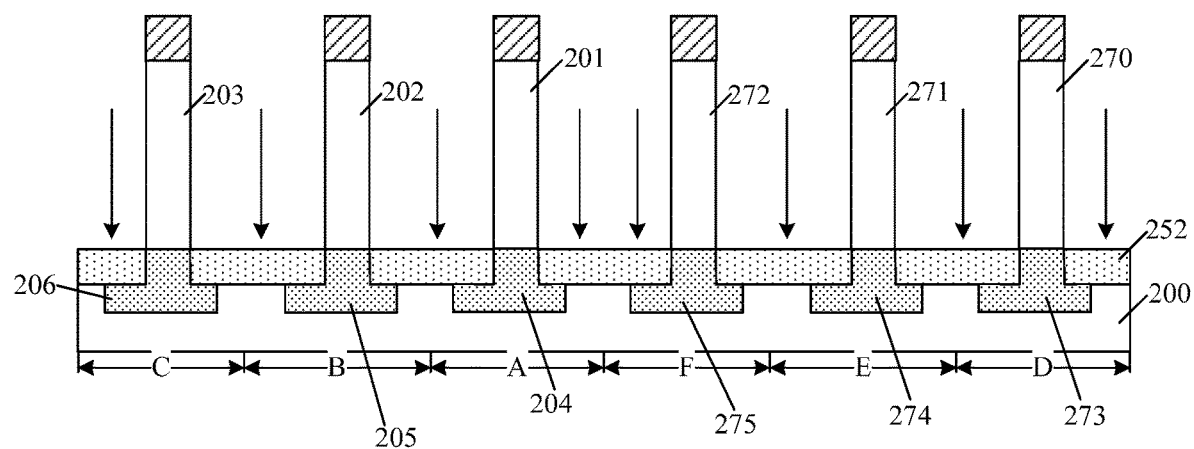

Referring to FIG. 3, a first isolation layer 252 is formed on a surface of the substrate 200. After the first isolation layer 252 is formed, a first source/drain region 204 is formed at a bottom of the first nanopillar 201 and in a portion of the substrate 200 in the first region A.

A material of the first isolation layer 252 includes silicon oxide or silicon oxynitride. The forming process of the first isolation layer 252 includes a chemical vapor deposition process or a physical vapor deposition process.

The first isolation layer 252 prevents subsequent excessive first doping ions from entering the substrate 200 in the first region A.

The forming method of the first source/drain region 204 includes: doping first doping ions into the first isolation layer 252 by using a first ion implantation process; performing a first annealing process to diffuse the first doping ions to a bottom of the first nanopillar 201 to form the first source/drain region 204.

In one embodiment, the first region A is configured to form a transfer transistor. The first doping ion is an N-type ion, such as a phosphorus ion or an arsenic ion.

Since the first nanopillar 201 is connected to the substrate 200, a portion of the first doping ions are also easily diffused into the substrate 200, so that the volume of the formed first source/drain region 204 is large.

Forming the SRAM cell further includes forming a third source/drain region 205 at a bottom of the second nanopillar 202 and in a portion of the substrate 200 in the second region B; forming a fifth source/drain region 206 at a bottom of the third nanopillar 203 and in a portion of the substrate 200 in the third region C; forming a seventh source/drain region 273 at a bottom of the fourth nanopillar 270 and in a portion of the substrate 200 in the fourth region D; forming a ninth source/drain region 274 at a bottom of the fifth nanopillar 271 and in a portion of the substrate 200 in the fifth region E; and forming a eleventh source/drain region 275 at a bottom of the fifth nanopillar 272 and in a portion of the substrate 200 in the sixth region F.

In one embodiment, the second region B is configured to form a first pull-down transistor. The third region C is configured to form a first pull-up transistor. The fifth region E is configured to form a second pull-down transistor. The sixth region F is configured to form a second pull-up transistor. The fourth region D is configured to form a second transfer transistor. The third source/drain region 205 has third doping ions. The conductivity type of the third doping ion is the same as the conductivity type of the first doping ion. The fifth source/drain region 206 has fifth doping ions. The conductivity type of the fifth doping ion is opposite to the conductivity type of the first doping ion. The seventh source/drain region 273 has seventh doping ions. The conductivity type of the seventh doping ion is the same as the conductivity type of the first doping ion. The ninth source/drain region 274 has ninth doping ions. The conductivity type of the ninth doping ion is the same as the conductivity type of the first doping ion. The eleventh source/drain region 275 has eleventh doping ions. The conductivity type of the eleventh doping ion is opposite to the conductivity type of the first doping ion. The third doping ions, the fifth doping ions, and the seventh doping ions are N-type ions. The fifth doping ions and the eleventh doping ions are P-type ions. The P-type ion includes a boron ion.

Figure 4:
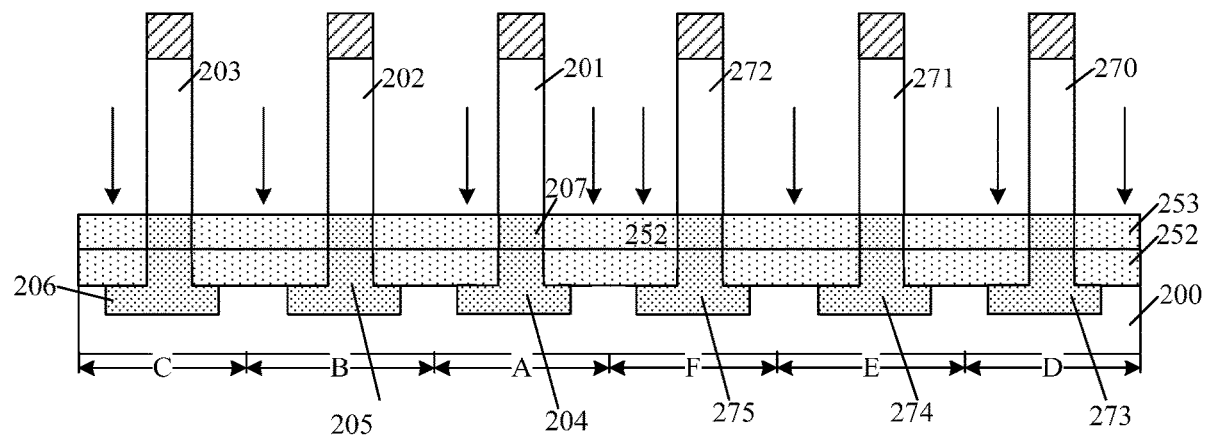

Referring to FIG. 4, a third isolation layer 253 is formed on a surface of the first isolation layer 252. After the third isolation layer 253 is formed, a first lightly doped region 207 is formed on a surface of the first source/drain region 204.

A material and a forming method of the third isolation layer 253 are the same as a material and a forming method of the first isolation layer 252.

Forming the first lightly doped region 207 includes: doping first lightly doping ions into the third isolation layer 253; performing a third annealing process so that the first lightly doping ions enter the first nanopillar 201 to form the first lightly doped region 207.

In one embodiment, the first region A is configured to form the first transfer transistor. The first lightly doping ion is an N-type ion, such as a phosphorus ion or an arsenic ion.

Forming the SRAM cell further includes: forming a third lightly doped region (not shown) on a surface of the third source/drain region 205; forming a fifth lightly doped region (not shown) on a surface of the fifth source/drain region 206; forming a seventh lightly doped region (not shown) on a surface of the seventh source/drain region 273; forming a ninth lightly doped region (not shown) on a surface of the ninth source/drain region 274; and forming a eleventh lightly doped region (not shown) on a surface of the eleventh source/drain region 275.

In one embodiment, the third lightly doped region has third lightly doping ions. The conductivity type of the third lightly doping ion is the same as the conductivity type of the first lightly doping ion. The fifth lightly doped region has fifth lightly doping ions. The conductivity type of the fifth lightly doping ion is opposite to the conductivity type of the first lightly doping ion. The seven lightly doped region has seventh lightly doping ions. The ninth lightly doped region has ninth doping ions. The eleventh lightly doped region has eleventh lightly doping ions. The conductivity types of the seventh doping ion and the ninth doping ion are the same as the conductivity type of the first lightly doping ion. The conductivity type of the eleventh lightly doping ion is opposite to the conductivity type of the first lightly doping ion.

When a SRAM cell current flows from a top of the first nanopillar 201 into a bottom of the first nanopillar 201, the first source/drain region 204 and the first lightly doped region 207 determine the magnitude of the current. When the SRAM cell current flows from a top of the second nanopillar 202 into a bottom of the second nanopillar 202, the third source/drain region 205 and the third lightly doped region determine the magnitude of the current. When the SRAM cell current flows from a top of the third nanopillar 203 into a bottom of the third nanopillar 203, the fifth source/drain region 206 and the third lightly doped region determine the magnitude of the current. When the SRAM cell current flows from a top of the fourth nanopillar 270 into a bottom of the fourth nanopillar 270, the seventh source/drain region 273 and the seventh lightly doped region determine the magnitude of the current. When the SRAM cell current flows from a top of the fifth nanopillar 271 into a bottom of the fifth nanopillar 271, the ninth source/drain region 274 and the ninth lightly doped region determine the magnitude of the current. When the SRAM cell current flows from a top of the sixth nanopillar 272 into a bottom of the sixth nanopillar 272, the eleventh source/drain region 275 and the eleventh lightly doped region determine the magnitude of the current.

Figure 5:
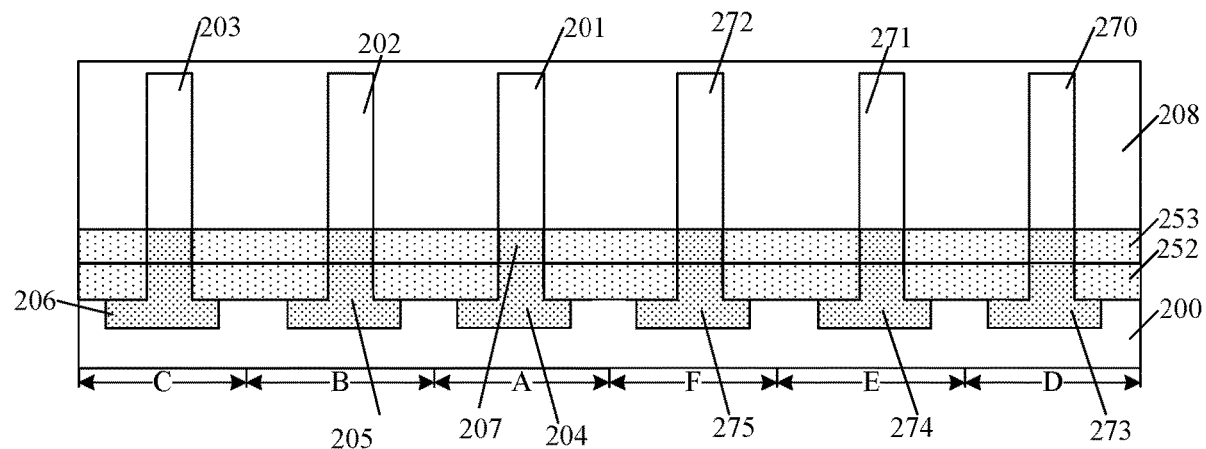

Referring to FIG. 5, after the first lightly doped region 207 is formed, a gate structure film 208 is formed on a surface of the third isolation layer 253. The gate structure film 208 surrounds the first nanopillar 201, the second nanopillar 202, and the third nanopillar 203, the fourth nanopillar 270, the fifth nanopillar 271, and the sixth nanopillar 272.

Forming the gate structure film 208 includes: forming an interface layer (not shown) on a surface of the third isolation layer 253 and a surface of the nanopillar 201; forming a gate dielectric layer on a surface of the interface layer (not shown); and forming a gate film on the gate dielectric layer.

A material of the interface layer includes silicon oxide. The forming process of the interface layer includes a chemical vapor deposition process or a physical vapor deposition process.

The interface layer is configured to improve a state of interface between the subsequent gate dielectric layer and the nanopillar 201.

A material of the gate dielectric layer is a high dielectric constant material. In one embodiment, the material of the gate dielectric layer includes ruthenium oxide. In other embodiments, the material of the gate dielectric layer includes: $La_2O_3$, HfSiON, $HfAlO_2$, $ZrO_2$, $Al_2O_3$ or $HfSiO_4$.

The forming process of the gate dielectric layer includes a chemical vapor deposition process or a physical vapor deposition process.

The material of the gate film includes metal. In one embodiment, the material of the gate film is tungsten. In other embodiments, the material of the gate film includes aluminum, copper, titanium, silver, gold, lead or nickel.

Figure 6:
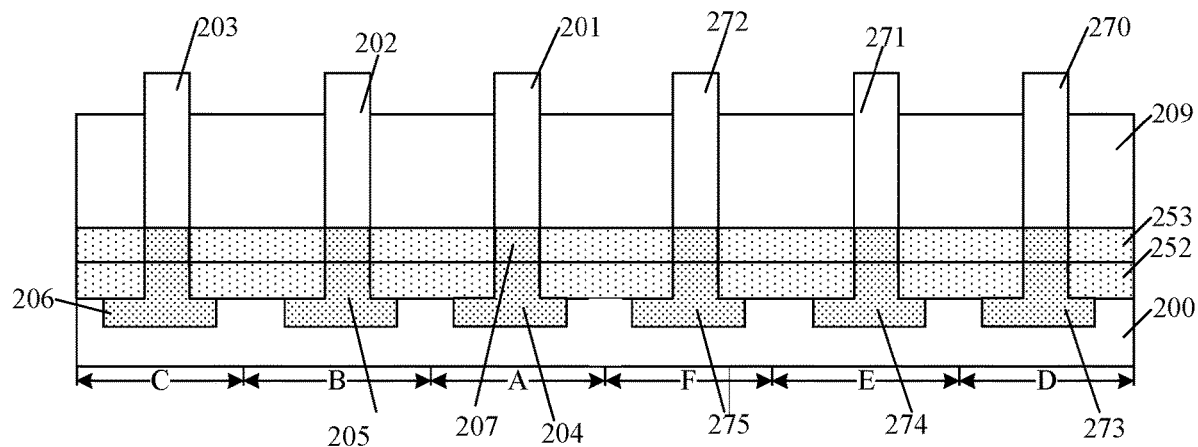

Referring to FIG. 6, a portion of the gate structure film 208 in the first region A is removed, and a portion of sidewalls and top surfaces of the first nanopillar 201 is exposed to form a first gate structure 209 surrounding the first nanopillar 201.

The process of removing a portion of the gate structure film 208 includes one or a combination of a dry etching process and a wet etching process.

Forming the SRAM cell further includes: removing a portion of the gate structure film 208 in the second region B, exposing a portion of sidewalls and top surfaces of the second nanopillar 202 to form a second gate structure (not shown) surrounding the second nanopillar 202; removing a portion of the gate structure film 208 in the third region C, exposing a portion of sidewalls and top surfaces of the third nanopillar 203 to form a third gate structure (not shown) surrounding the third nanopillar 203; removing a portion of the gate structure film 208 in the fourth region D, exposing a portion of sidewalls and top surfaces of the fourth nanopillar 270 to form a fourth gate structure (not shown) surrounding the fourth nanopillar 270; removing a portion of the gate structure film 208 in the fifth region E, exposing a portion of sidewalls and top surfaces of the fifth nanopillar 271 to form a fifth gate structure (not shown) surrounding the fifth nanopillar 271; and removing a portion of the gate structure film 208 in the sixth region E, exposing a portion of sidewalls and top surfaces of the sixth nanopillar 272 to form a sixth gate structure (not shown) surrounding the sixth nanopillar 272.

In one embodiment, the first gate structure 209, the second gate structure, the third gate structure, the fourth gate structure, the fifth gate structure, and the sixth gate structure are formed simultaneously. In other embodiments, the first gate structure, the second gate structure, the third gate structure, the fourth gate structure, the fifth gate structure, and the sixth gate structure are not formed simultaneously.

Figure 7:
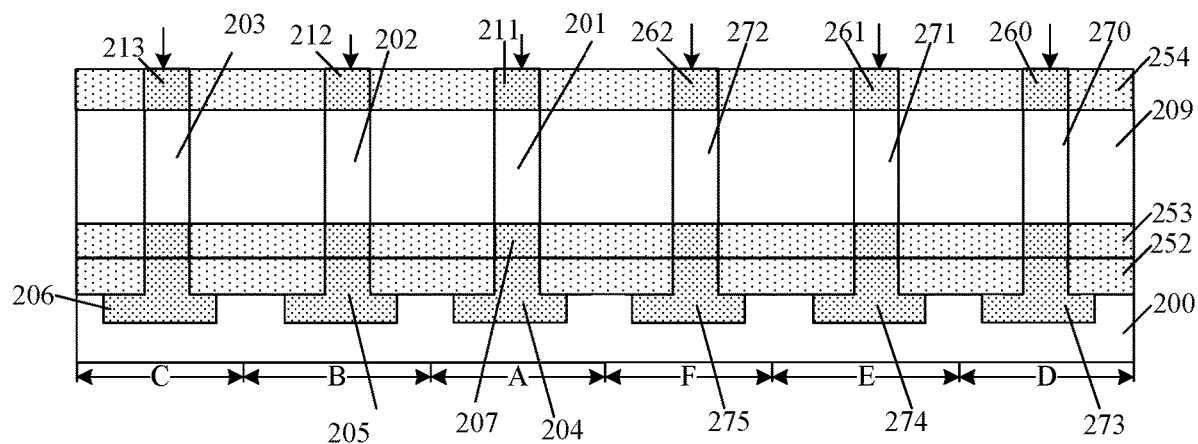

Referring to FIG. 7, a second isolation layer 254 is formed on surfaces of the first gate structure 209, the second gate structure and the third gate structure, and surfaces of the fourth gate structure, the fifth gate structure, and the sixth gate structure. The second isolation layer 254 exposes a portion of top surfaces of the first nanopillar 201. After the second isolation layer 254 is formed, a second source/drain region 211 is formed at a top of the first nanopillar 201.

The forming process of the second source/drain region 211 includes a second ion implantation process. The second ion implantation process includes implanting second doping ions.

When the SRAM cell current flows from a bottom of the first nanopillar 201 into a top of the first nanopillar 201, the second source/drain region 211 determines the magnitude of the current.

The second source/drain region 211 and the first source/drain region 204 are respectively formed by a two-step process, so that the volumes of the first source/drain region 204 and the second source/drain region 211 are not completely the same.

Forming the SRAM cell further includes forming a fourth source/drain region 212 at a top of the second nanopillar 202; forming a sixth source/drain region 213 at a top of the third nanopillar 203; forming an eighth source/drain region 260 at a top of the third nanopillar 203; forming a tenth source/drain region 261 at a top of the fourth nanopillar 271; forming a twelfth source/drain region 262 at a top of the sixth nanopillar 272;

The fourth source/drain region 212 has fourth doping ions. The conductivity type of the fourth doping ion is the same as the conductivity type of the second doping ion. The sixth source/drain region 213 has sixth doping ions. The conductivity type of the sixth doping ion is opposite to the conductivity type of the second doping ion. The eighth source/drain region 260 has eighth doping ions. The tenth source/drain region 261 has tenth doping ions. The conductivity type of the eighth doping ion is the same as the conductivity type of the second doping ion. The conductivity type of the tenth doping ion is the same as the conductivity type of the second doping ions. The twelfth source/drain region 262 has twelfth doping ions. The conductivity type of the tenth doping ion is opposite to the conductivity type of the second doping ions.

In one embodiment, the second doped source/drain ions are N-type ions. The fourth doping ions are N-type ions, and the sixth doping ions are P-type ions.

In other embodiments, the second doped source/drain ions are P-type ions. The fourth doping ions are P-type ions, and the sixth doping ions are N-type ions.

Figure 8:
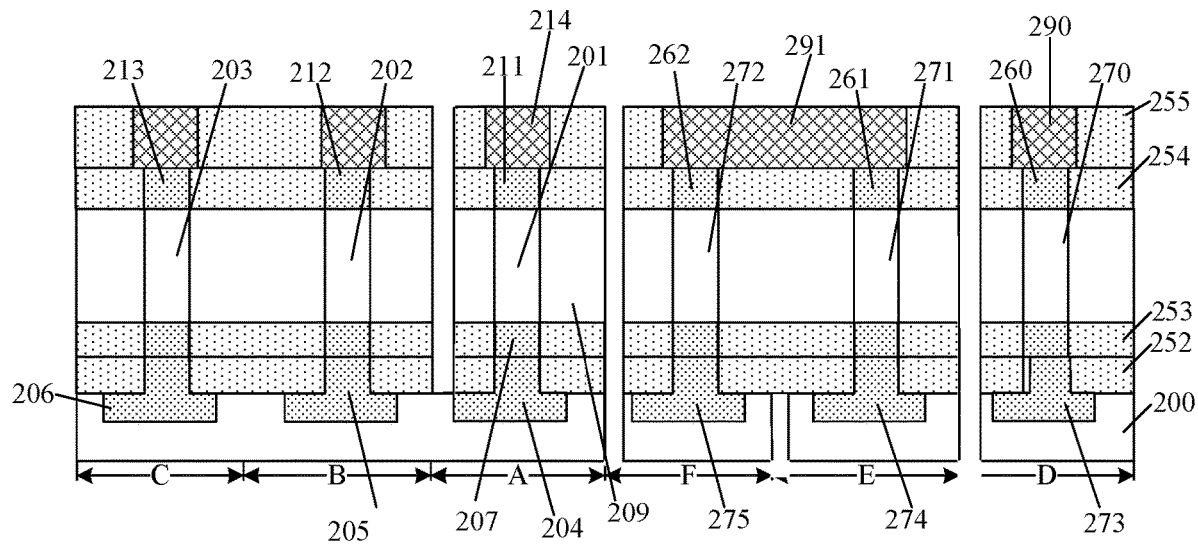

Referring to FIG. 8, a first dielectric layer 255 is formed on a surface of the third isolation layer and a surface of the second source/drain region 211. A first opening (not shown) is formed in the first dielectric layer 255. A bottom of the first opening exposes a top surface of the second source/drain region 211. A first electrodes 214 is formed in the first opening.

A material of the first dielectric layer 255 includes silicon oxide, silicon oxynitride or a low dielectric constant material.

The forming process of the first dielectric layer 255 includes a chemical vapor deposition process or a physical vapor deposition process.

The forming process of the first opening includes one or a combination of a dry etching process and a wet etching process.

Forming the first electrode 214 includes: forming a first electrode film in the first opening and on a surface of the first dielectric layer 255; planarizing the first electrode film until a top surface of the first dielectric layer 255 is exposed; and forming the first electrode 214 in the first opening.

A material of the first electrode film is metal. The forming process of the first electrode film includes a chemical vapor deposition process or a physical vapor deposition process.

The process of planarizing the first electrode film includes a chemical mechanical polishing process.

Forming the SRAM cell further includes: forming a second electrode (not shown) at a top of the fourth source/drain region 212; forming a third electrode (not shown) at a top of the sixth source/drain region 213; separating the third electrode and the second electrode by a first dielectric layer 255; forming a fourth electrode 290 at a top of the eighth source/drain region 260; and forming a fifth electrode 291 at tops of the tenth source/drain region 261 and the twelfth source/drain region 262.

After the second electrodes and the third electrodes are formed, forming the SRAM cell further includes performing a cutting treatment between the first electrodes 214 and the second electrodes.

In one embodiment, after the fourth electrodes and the fifth electrodes are formed, forming the SRAM cell further includes: performing a cutting treatment between the fourth electrodes 290 and the fifth electrodes; performing a cutting treatment between the substrate 200 in the fourth region D and on the substrate 200 in the fifth region E; performing a cutting treatment between the substrate 200 in the fifth region E and on the substrate 200 in the sixth region F. The method facilitates forming the SRAM cell.

Accordingly, the present disclosure also provides a semiconductor device formed by the above method.

Figure 9:
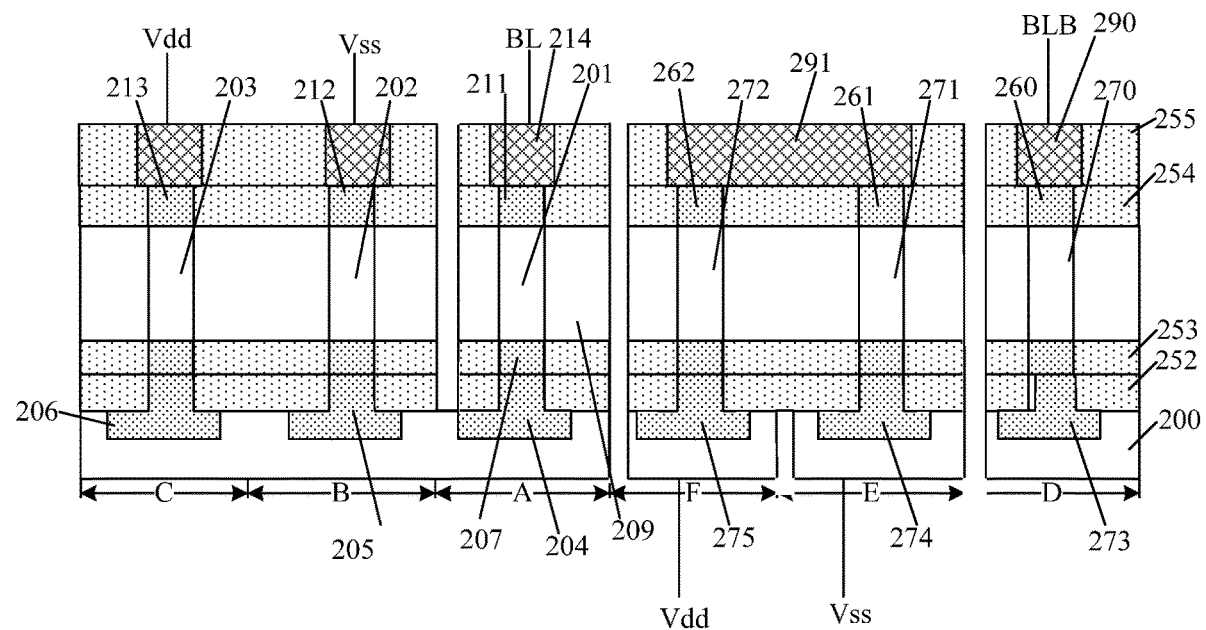
FIG. 9 illustrates a schematic diagram of a semiconductor device consistent with various disclosed embodiments in the present disclosure.
Figure 10:
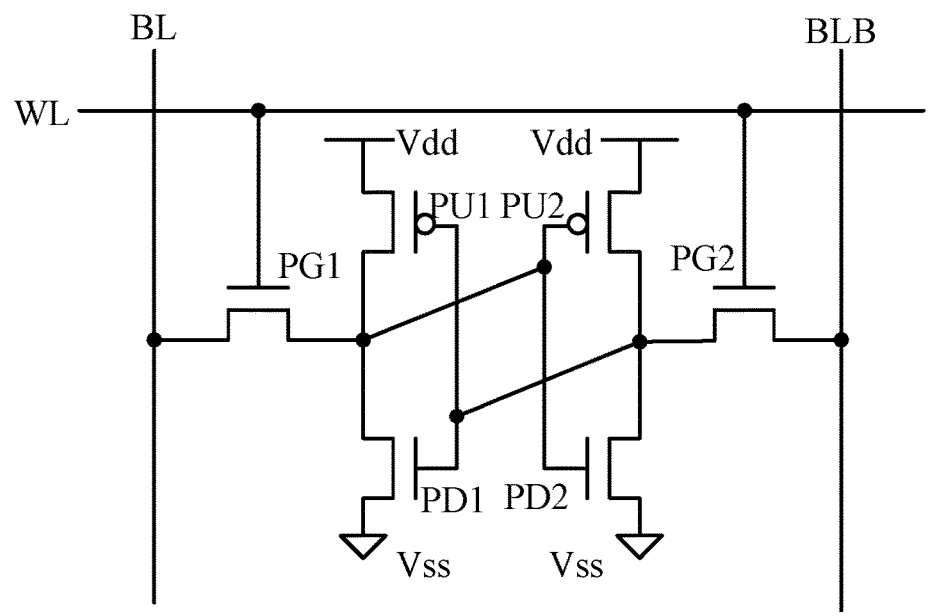
FIG. 10 illustrates a circuit diagram of a semiconductor device consistent with various disclosed embodiments in the present disclosure.

FIG. 9 illustrates a schematic diagram of a semiconductor device consistent with various disclosed embodiments in the present disclosure. FIG. 10 illustrates a circuit diagram of a semiconductor device consistent with various disclosed embodiments in the present disclosure.

Referring to FIG. 9 and FIG. 10, the present disclosure also provides an operating method of the above semiconductor device. The operating method includes connecting first bit line BL signals to the second source/drain region 211; and connecting word line signals to the first gate structure 209.

The semiconductor device further includes: the substrate 200 including a second region B; a second nanopillar 202, formed on a surface of the substrate 200 in the second region B and perpendicular to the surface of the substrate 200; a third source/drain region 205, formed at a bottom of the second nanopillar 202 and in a portion of the substrate 200 in the second region B, and electrically connected to the first source/drain region 204; a second gate structure, surrounding the second nanopillar 202 and formed on the third source/drain region 205; a fourth source/drain region 212, formed at a top of the second nanopillar 202 and on the second gate structure. The operating method further includes the fourth source/drain region 212 being connected to a voltage source supply (Vss).

The semiconductor device further includes: the substrate 200 including a third region C; a third nanopillar 203, formed on a surface of the substrate 200 in the third region C and perpendicular to the surface of the substrate 200; a fifth source/drain region 206, formed at a bottom of the third nanopillar 203 and in a portion of the substrate 200 in the third region C, and electrically connected to the third source/drain region 205; a third gate structure, surrounding the third nanopillar 202 and formed on the fifth source/drain region 206; a sixth source/drain region 213, formed at a top of the third nanopillar 203 and on the third gate structure. The operating method further includes the sixth source/drain region 213 being connected to a voltage drain supply (Vdd).

The semiconductor device further includes: the substrate 200 including a fourth region D, a fourth nanopillar 270, formed on a surface of the substrate 200 in the fourth region D and perpendicular to the surface of the substrate 200; a seventh source/drain region 273, formed at a bottom of the fourth nanopillar 270 and in a portion of the substrate 200 in the fourth region D; a fourth gate structure, surrounding the fourth nanopillar 270 and formed on the seventh source/drain region 273; an eighth source/drain region 260, formed at a top of the fourth nanopillar 270 and on the fourth gate structure. The operating method further includes: the eighth source/drain region 260 being connected to second bit line bar (BLB); and the fifth gate structure being connected to word lines (WL).

The semiconductor device further includes: the substrate 200 including a fifth region E, a fifth nanopillar 271, formed on a surface of the substrate 200 in the fifth region E and perpendicular to the surface of the substrate 200; a ninth source/drain region 274, formed at a bottom of the fifth nanopillar 271 and in a portion of the substrate 200 in the fifth region E; a fifth gate structure, surrounding the fifth nanopillar 271 and formed on the ninth source/drain region 274; a tenth source/drain region 261, formed at a top of the fifth nanopillar 271 and on the fifth gate structure. The operating method further includes: the substrate in the fifth region being isolated from the substrate in the fourth region; and the ninth source/drain region 274 being connected to a voltage source supply (Vss).

The semiconductor device further includes: the substrate 200 including a sixth region F, a sixth nanopillar 272, formed on a surface of the substrate 200 in the sixth region F and perpendicular to the surface of the substrate 200; a eleventh source/drain region 275, formed at a bottom of the sixth nanopillar 272 and in a portion of the substrate 200 in the sixth region F; a sixth gate structure, surrounding the sixth nanopillar 272 and formed on the eleventh source/drain region 275; a twelfth source/drain region 262, formed at a top of the sixth nanopillar 272 and on the sixth gate structure. The operating method further includes: the tenth source/drain region 261 being connected to the twelfth source/drain region 262; and the eleventh source/drain region 275 being connected to a voltage drain supply (Vdd).

The first gate structure 209, the first source/drain region 204, and the second source/drain region 211 constitute a first transfer transistor PG1. The second gate structure, the third source/drain region 205, and the fourth source/drain region 212 constitute a first pull-down transistor PD1. The third gate structure, the fifth source/drain region 206, and the sixth source/drain region 213 constitute a first pull-up transistor PU1. The fourth gate structure, the seventh source/drain region 273, and the eighth source/drain region 260 constitute a second transfer transistor PG2. The fifth gate structure, the ninth source/drain region 274, and the tenth source/drain region 261 constitute a second pull-down transistor PD2. The sixth gate structure, the eleventh source/drain region 275, and the twelfth source/drain region 262 constitute a second pull-up transistor PU2.

Although the present disclosure is disclosed above, the present disclosure is not limited thereto. Any changes and modifications can be made by those skilled in the art without departing from the spirit and scope of the disclosure. The protection scope of the present disclosure is defined by the appended claims.

What is claimed is:

1. A semiconductor device, comprising:
a substrate, including a first region;
a first nanopillar, formed on a substrate surface of the first region and perpendicular to the substrate surface;
a first isolation layer on the substrate surface;
a first source/drain region, formed in a bottom portion of the first nanopillar and in a portion of the substrate in the first region;
a second isolation layer on the first isolation layer;
a first lightly doped region, formed on a top surface of the first source/drain region in the first nanopillar, wherein a top surface of the first isolation layer is coplanar with the top surface of the first source/drain region, and a top surface of the second isolation layer is coplanar with a top surface of the lightly doped region;
a first gate structure, surrounding the first nanopillar and formed on the second isolation layer, wherein the top surface of the lightly doped region is coplanar with a bottom surface of the first gate structure; and
a second source/drain region, formed at a top of the first nanopillar and on the first gate structure.

2. The device according to claim 1, wherein:
the substrate further comprises a second region;
a second nanopillar is formed on a substrate surface on the second region and is perpendicular to the substrate surface;
a third source/drain region is formed at a bottom of the second nanopillar and in a portion of the substrate in the second region, and the third source/drain region is electrically connected to the first source/drain region;
a second gate structure surrounds the second nanopillar, and is formed on the third source/drain region;
a fourth source/drain region is formed at a top of the second nanopillar and on the second gate structure;
the substrate further comprises a third region;
a third nanopillar is formed on a substrate surface on the third region and is perpendicular to the substrate surface;
a fifth source/drain region is formed at a bottom of the third nanopillar and in a portion of the substrate in the third region, and the fifth source/drain region is electrically connected to the third source/drain region;
a third gate structure surrounds the third nanopillar, and is formed on the fifth source/drain region;
a sixth source/drain region is formed at a top of the third nanopillar and on the third gate structure.

3. The device according to claim 2, further comprising:
a first electrode, formed on a top surface of the second source/drain region;
a second electrode, formed on a top surface of the fourth source/drain region;
a third electrode, formed on a top surface of the sixth source/drain region; and
a first dielectric layer, formed between the second and third electrodes, and electrically isolated from the second electrode.

4. The device according to claim 3, wherein:
the substrate further comprises a fourth region;

a fourth nanopillar is formed on a substrate surface on the fourth region, and is perpendicular to the substrate surface;

a seventh source/drain region is formed at a bottom of the fourth nanopillar and in a portion of the substrate in the fourth region;

a fourth gate structure surrounds the second nanopillar, and the fourth gate structure is formed on the seventh source/drain region;

an eighth source/drain region is formed at a top of the fourth nanopillar, and the eighth source/drain region is formed on the fourth gate structure;

the substrate further comprises a fifth region;

a fifth nanopillar is formed on a substrate surface on the fifth region, and is perpendicular to the substrate surface;

a ninth source/drain region is formed at a bottom of the fifth nanopillar and in a portion of the substrate in the fifth region;

a fifth gate structure surrounds the fifth nanopillar, and the fifth gate structure is formed on the ninth source/drain region;

a tenth source/drain region is formed at a top of the fifth nanopillar, and on the fifth gate structure;

the substrate further comprises a sixth region;

a sixth nanopillar is formed on a substrate surface on the sixth region, and is perpendicular to the substrate surface;

an eleventh source/drain region is formed at a bottom of the sixth nanopillar and in a portion of the substrate in the sixth region;

a sixth gate structure surrounds the sixth nanopillar, and the sixth gate structure is formed on the eleventh source/drain region;

a twelfth source/drain region is formed at a top of the sixth nanopillar, and on the sixth gate structure.

5. The device according to claim 4, further comprising:
a fourth electrode, formed on a top surface of the eighth source/drain region;
a fifth electrode, connecting the top surface of the tenth source/drain region and the twelfth source/drain region;
the fourth electrode being electrically isolated from the fifth electrode; and
a first dielectric layer, formed between the substrate in the fourth region and the substrate in the fifth region and formed between the substrate in the fifth region and the substrate in the sixth region.

6. The device according to claim 1, further including:
a first isolation layer, formed on the substate, wherein a top surface of the first isolation layer is coplanar with the top surface of the first source/drain region;
a second isolation layer on the first isolation layer, wherein a top surface of the second isolation layer is coplanar with a top surface of the lightly doped region.

7. A method of forming a semiconductor device, comprising:
providing a substrate, comprising a first region;
forming a first nanopillar on a substrate surface of the first region, the first nanopillar being perpendicular to the substrate surface;
forming a first isolation layer on the substrate surface;
forming a first source/drain region in a bottom portion of the first nanopillar and in a portion of the substrate in the first region;
forming a second isolation layer on the first isolation layer;

forming a first lightly doped region on a top surface of the first source/drain region in the first nanopillar, wherein a top surface of the first isolation layer is coplanar with the top surface of the first source/drain region, and a top surface of the second isolation layer is coplanar with a top surface of the lightly doped region;

forming a first gate structure on the second isolation layer, the first gate structure surrounding the first nanopillar, wherein the top surface of the lightly doped region is coplanar with a bottom surface of the first gate structure; and forming a second source/drain region at a top of the first nanopillar, and on the first gate structure.

8. The method according to claim 7, wherein:
the first source/drain region comprises first doping ions; and
forming the first source/drain region comprises:
doping the first doping ions in the first isolation layer; and
performing an annealing treatment to diffuse the first doping ions into a bottom of the first nanopillar and a portion of the substrate in the first region to form the first source/drain region.

9. The method according to claim 7, wherein:
the second source/drain region has second doping ions; and
forming the second source/drain region comprises:
doping the second doping ions in the second isolation layer; and
performing an annealing treatment to diffuse the second doping ions into a top of the second nanopillar to form the second source/drain region.

10. The method according to claim 9, further including:
forming a third isolation layer on the first isolation layer, wherein a top surface of the first isolation layer is coplanar with the top surface of the first source/drain region, and a top surface of the second isolation layer is coplanar with a top surface of the lightly doped region.

11. An operation method of a semiconductor device, comprising:
providing the semiconductor device including:
a substrate, including a first region,
a first nanopillar, formed on a substrate surface of the first region and perpendicular to the substrate surface,
a first isolation layer on the substrate surface,
a first source/drain region, formed in a bottom portion of the first nanopillar and in a portion of the substrate in the first region,
a second isolation layer on the first isolation layer,
a first lightly doped region, formed on a top surface of the first source/drain region in the first nanopillar, wherein a top surface of the first isolation layer is coplanar with the top surface of the first source/drain region, and a top surface of the second isolation layer is coplanar with a top surface of the lightly doped region,
a first gate structure, surrounding the first nanopillar and formed on the second isolation layer, wherein the top surface of the lightly doped region is coplanar with a bottom surface of the first gate structure, and
a second source/drain region, formed at a top of the first nanopillar and on the first gate structure;
connecting first bit line signals to the second source/drain region; and
connecting word line signals to the first gate structure.

12. The method according to claim 11, wherein:
the device further comprises:
- the substrate including a second region,
  - a second nanopillar, formed on a substrate surface on the second region and perpendicular to the substrate surface,
  - a third source/drain region, formed at a bottom of the second nanopillar and in a portion of the substrate in the second region, and electrically connected to the first source/drain region,
  - a second gate structure, surrounding the second nanopillar, and formed on the third source/drain region, and
  - a fourth source/drain region, formed at a top of the second nanopillar and on the second gate structure; and the method further comprises:
- the fourth source/drain region being connected to a voltage source supply.

13. The method according to claim 12, wherein:
the device further comprises:
- the substrate including a third region,
  - a third nanopillar, formed on a substrate surface on the third region and perpendicular to the substrate surface,
  - a fifth source/drain region, formed at a bottom of the third nanopillar and in a portion of the substrate in the third region, and electrically connected to the third source/drain region,
  - a third gate structure, surrounding the third nanopillar, and formed on the fifth source/drain region, and
  - a sixth source/drain region, formed at a top of the third nanopillar and on the third gate structure; and the method further comprises:
- the sixth source/drain region being connected to a voltage drain supply.

14. The method according to claim 13, wherein:
the device further comprises:
- the substrate including a fourth region,
  - a fourth nanopillar, formed on a substrate surface on the fourth region and perpendicular to the substrate surface,
  - a seventh source/drain region, formed at a bottom of the fourth nanopillar and in a portion of the substrate in the fourth region,
  - a fourth gate structure, surrounding the fourth nanopillar, and formed on the seventh source/drain region, and
  - an eighth source/drain region, formed at a top of the fourth nanopillar and on the fourth gate structure; and the method further comprises:
- the eighth source/drain region being connected to second bit line signals, and
- the fifth gate structure being connected to word line signals.

15. The method according to claim 14, wherein:
the device further comprises:
- the substrate including a fifth region,
  - a fifth nanopillar, formed on a substrate surface on the fifth region and perpendicular to the substrate surface,
  - a ninth source/drain region, formed at a bottom of the fifth nanopillar and in a portion of the substrate in the fifth region,
  - a fifth gate structure, surrounding the fifth nanopillar, and formed on the ninth source/drain region, and
  - a tenth source/drain region, formed at a top of the fifth nanopillar and on the fifth gate structure; and the method further comprises:
- the substrate of the fifth region being isolated from the substrate of the fourth region, and
- the ninth source/drain region being connected to a voltage source supply.

16. The method according to claim 15, wherein:
the device further comprises:
- the substrate including a sixth region,
  - a sixth nanopillar, formed on a substrate surface on the sixth region and perpendicular to the substrate surface,
  - an eleventh source/drain region, formed at a bottom of the sixth nanopillar and in a portion of the substrate in the sixth region,
  - a sixth gate structure, surrounding the sixth nanopillar, and formed on the eleventh source/drain region, and
  - a twelfth source/drain region, formed at a top of the sixth nanopillar and on the sixth gate structure; and the method further comprises:
- the substrate in the sixth region being isolated from the substrate in the fifth region, and
- the eleventh source/drain region being connected to a voltage drain supply.

* * * * *